United States Patent
Darwish

(10) Patent No.: US 6,764,906 B2
(45) Date of Patent: Jul. 20, 2004

(54) METHOD FOR MAKING TRENCH MOSFET HAVING IMPLANTED DRAIN-DRIFT REGION

(75) Inventor: Mohamed N. Darwish, Campbell, CA (US)

(73) Assignee: Siliconix incorporated, Santa Clara, CA (US)

( * ) Notice: Subject to any disclaimer, the term of this patent is extended or adjusted under 35 U.S.C. 154(b) by 0 days.

(21) Appl. No.: 10/317,568

(22) Filed: Dec. 12, 2002

(65) Prior Publication Data

US 2003/0102564 A1 Jun. 5, 2003

Related U.S. Application Data

(63) Continuation-in-part of application No. 09/898,652, filed on Jul. 3, 2001, now Pat. No. 6,569,738.

(51) Int. Cl.$^7$ .......................................... H02L 21/336
(52) U.S. Cl. ........................ 438/270; 438/268; 438/1; 438/558; 438/271; 438/272
(58) Field of Search ................................ 438/270, 268, 438/558, 271, 272

(56) References Cited

U.S. PATENT DOCUMENTS

| | | | |
|---|---|---|---|
| 4,546,367 A | 10/1985 | Schutten et al. | 357/23.4 |
| 4,683,643 A | 8/1987 | Nakajima et al. | 437/203 |
| 4,914,058 A | 4/1990 | Blanchard | 437/203 |
| 4,967,245 A | 10/1990 | Cogan et al. | 357/23.4 |
| 5,424,231 A | 6/1995 | Yang | 437/40 |
| 5,442,214 A | 8/1995 | Yang | 257/328 |
| 5,473,176 A | 12/1995 | Kakumoto | 257/192 |
| 5,486,714 A | 1/1996 | Hong | 257/321 |
| 5,882,971 A | 3/1999 | Wen | 438/276 |
| 5,915,180 A | 8/1999 | Hara et al. | 438/270 |
| 5,976,936 A | 11/1999 | Miyajima | 438/268 |
| 6,020,600 A | 2/2000 | Miyajima et al. | 257/76 |
| 6,074,909 A | 6/2000 | Gruening | 438/242 |
| 6,084,264 A | 7/2000 | Darwish | |
| 6,144,054 A | 11/2000 | Agahi et al. | 257/296 |
| 6,291,298 B1 | 9/2001 | Williams et al. | 438/270 |
| 6,444,528 B1 | 9/2002 | Murphy | 438/270 |
| 6,569,738 B2 * | 5/2003 | Darwish | 438/270 |

FOREIGN PATENT DOCUMENTS

| | | |
|---|---|---|
| EP | 0 801 426 A2 | 10/1997 |
| JP | 6-21468 | 1/1994 |
| JP | 04194917 | 1/1994 |
| JP | 11-163342 | 6/1999 |
| WO | PCT/US97/12046 | 1/1998 |

OTHER PUBLICATIONS

U.S. patent application Ser. No. 10/326,311, Darwish et al., filed Dec. 19, 2002.

* cited by examiner

*Primary Examiner*—Long Pham
(74) *Attorney, Agent, or Firm*—Silicon Valley Patent Group, LLP

(57) ABSTRACT

A trench MOSFET is formed in a structure which includes a P-type epitaxial layer overlying an N+ substrate. A trench is formed in the epitaxial layer. A deep implanted N layer is formed below the trench at the interface between the substrate and the epitaxial layer, and N-type dopant is implant through the bottom of the trench to form an N region in the epitaxial layer below the trench but above and separated from the deep N layer. The structure is heated to cause the N layer to diffuse upward and the N region to diffuse downward. The diffusions merge to form a continuous N-type drain-drift region extending from the bottom of the trench to the substrate. Alternatively, the drain-drift region may be formed by implanting N-type dopant through the bottom of the trench at different energies, creating a stack of N-type regions that extend from the bottom of the trench to the substrate.

28 Claims, 18 Drawing Sheets

METHOD FOR MAKING TRENCH MOSFET HAVING IMPLANTED DRAIN-DRIFT REGION

This application is a continuation-in-part of co-owned application Ser. No. 09/898,652, filed Jul. 3, 2001, now U.S. Pat. No. 6,569,738 which is incorporated herein by reference in its entirety.

FIELD OF THE INVENTION

This invention relates to power MOSFETs and in particular to a trench-gated power MOSFET with superior on-resistance and breakdown characteristics. This invention also relates to a process for manufacturing such a MOSFET.

BACKGROUND OF THE INVENTION

A conventional trench-gated power MOSFET 10 is shown in the cross-sectional view of FIG. 1. MOSFET 10 is formed in an N+ semiconductor substrate 11, on which an N-epitaxial layer 12 is grown. A gate 13 is formed in a trench 14 which extends downward from the top surface of the N-epitaxial (N-epi) layer 12. The gate is typically made of polycrystalline silicon (polysilicon) and is electrically isolated from the N-epi layer 12 by an oxide layer 15. The voltage applied to the gate 13 controls the current flowing between an N+ source 16 and a drain 18, through a channel located adjacent the wall of the trench 14 in a P body 17. Drain 18 includes the N-epi layer 12 and N+ substrate 11. A metal contact layer 19 makes electrical contact with the N+ source 16 and with the P body 17 through a P+ body contact region 20. A similar metal contact layer (not shown) typically provides an electrical connection with the bottom side of the drain 18.

Ideally, the MOSFET would operate as a perfect switch, with infinite resistance when turned off and zero resistance when turned on. In practice, this goal cannot be achieved, but nonetheless two important measures of the efficiency of the MOSFET are its on-resistance and avalanche breakdown voltage (hereinafter "breakdown voltage"). Another important criterion is where the breakdown occurs. Since the drain is normally biased positive with respect to the source, the junction 21 is reverse-biased, and avalanche breakdown normally occurs at the corner of the trench, where the electric field is at a maximum. Breakdown creates hot carriers which can damage or rupture the gate oxide layer 15. It is therefore desirable to design the device such that breakdown occurs in the bulk silicon, away from the trench 14.

Another important characteristic of a MOSFET is its threshold voltage, which is the voltage that needs to be applied to the gate in order to create an inversion layer in the channel and thereby turn the device on. In many cases it is desirable to have a low threshold voltage, and this requires that the channel region be lightly doped. Lightly doping the channel, however, increases the risk of punchthrough breakdown, which occurs when the depletion region around the junction 21 expands so as to reach all the way across the channel to the source. The depletion region expands more rapidly when the body region is more lightly doped.

One technique for reducing the strength of the electric field at the corners of the trench and promoting breakdown in the bulk silicon away from the trench is taught in U.S. Pat. No. 5,072,266 to Bulucea et al. (the "Bulucea patent") This technique is illustrated in FIG. 2, which shows a MOSFET 25, which is similar to MOSFET 10 of FIG. 1 except that a deep P+ diffusion 27 extends downward from the P body 17 to a level below the bottom of the trench. Deep P+ diffusion 27 has the effect of shaping the electric field in such a way as to reduce its strength at the corner 29 of the trench.

While the technique of the Bulucea patent improves the breakdown performance of the MOSFET, it sets a lower limit on the cell pitch, shown as "d" in FIG. 2, because if the cell pitch is reduced too much, dopant from the deep P+ diffusion will get into the channel region of the MOSFET and increase its threshold voltage. Reducing the cell pitch increases the total perimeter of the cells of the MOSFET, providing a greater gate width for the current, and thereby reduces the on-resistance of the MOSFET. Thus, using the technique of the Bulucea patent to improve the breakdown characteristics of the MOSFET makes it more difficult to reduce the on-resistance of the MOSFET.

To summarize, the design of a power MOSFET requires that a compromise be made between the threshold and breakdown voltages and between the on-resistance and breakdown characteristics of the device. There is thus a clear need for a MOSFET structure that avoids or minimizes these compromises without adding undue complexity to the fabrication process.

SUMMARY OF THE INVENTION

In accordance with this invention a power MOSFET is formed in a semiconductor substrate of a first conductivity type which is overlain by an epitaxial layer of a second conductivity type. A trench is formed in the epitaxial layer. The power MOSFET also includes a gate positioned in the trench and electrically isolated from the epitaxial layer by an insulating layer which extends along the side walls and bottom of the trench. The epitaxial layer comprises a source region of the first conductivity type, the source region being located adjacent a top surface of the epitaxial layer and a wall of the trench; a base or body of the second conductivity type; and a drain-drift region of the first conductivity type extending from the substrate to the bottom of the trench, a junction between the drain-drift region and the body extending from the substrate to a side wall of the trench. The power MOSFET can optionally include a threshold adjust implant, and the epitaxial layer can include two or more sublayers having different dopant concentrations ("stepped epi layer").

In an alternative embodiment the trench extends through the entire epitaxial layer and into the substrate, and there is no need for the drain-drift region.

This invention also includes a process of fabricating a power MOSFET comprising providing a substrate of a first conductivity type; growing an epitaxial layer of a second conductivity type opposite to the first conductivity type on the substrate; forming a trench in the epitaxial layer; introducing dopant of the first conductivity type through a bottom of the trench to form a drain-drift region, the drain-drift region extending between the substrate and the bottom of the trench; forming an insulating layer along the bottom and a sidewall of the trench; introducing a conductive gate material into the trench; and introducing dopant of the first conductivity type into the epitaxial layer to form a source region, the drain-drift region and the source region being formed under conditions such that the source region and drain-drift region are separated by a channel region of the epitaxial layer adjacent the side wall of the trench. The dopant used to form the drain-drift region may be implanted through the same mask that is used to etch the trench.

There are several ways for forming the drain-drift region. The following are several examples. Dopant of the first conductivity type may be implanted into the region between the bottom of the trench and the substrate, with substantially no subsequent diffusion of the dopant. The dopant may be implanted at less energy into a region just below the bottom of the trench and may be diffused downward until it merges into the substrate. A "deep" submerged region of dopant may be formed at or near the interface between the substrate and the epitaxial layer, and the dopant may be diffused upward until it reaches the bottom of the trench. The deep region may be formed by implanting dopant at a relatively high energy through the trench bottom. Both a deep region of dopant near the substrate/epitaxial layer interface and region of dopant just below the trench may be formed, and the regions may be diffused upward and downward, respectively, until they merge. A series of implants may be performed through the bottom of the trench to create a "stack" of regions that together form a drain-drift region.

Instead of growing an epitaxial layer of a second conductivity type on the substrate, an epitaxial layer of the first conductivity type may be grown, and a dopant of the second conductivity type may be implanted into the epitaxial layer and diffused downward until the dopant reaches the interface between the substrate and the epitaxial layer.

Regardless of whether an epitaxial layer of the first or second conductivity type is used, dopant of the second conductivity type may be implanted to form a more heavily doped body diffusion or as a threshold adjust implant.

Alternatively, the trench can be made to extend through the epitaxial layer to the substrate. In this embodiment the drain-drift region becomes unnecessary.

A MOSFET of this invention has several advantages, including the following. Because the drain-drift region is surrounded laterally by a second conductivity type portion of the epitaxial layer, more effective depletion occurs and more first conductivity type dopant can be put into the drain-drift region, thereby decreasing the on-resistance of the MOSFET. Because the profile of the dopant in the channel region is relatively flat, the MOSFET can be made less vulnerable to punchthrough breakdown without increasing its threshold voltage. Since the second conductivity type portions of the epitaxial layer extend to the substrate except in the areas of the drain-drift region, there is no need to form an additional second conductivity type layer for terminating the device. The separate mask for the deep diffusion of the Bulucea patent and the termination region can be eliminated. Eliminating the deep body diffusion of the Bulucea patent allows for increased cell density and reduced on-resistance.

A power MOSFET according to this invention can be fabricated in any type of cell geometry including, for example, closed cells of a hexagonal or square shape or cells in the form of longitudinal stripes.

DESCRIPTION OF THE INVENTION

Figure 1:
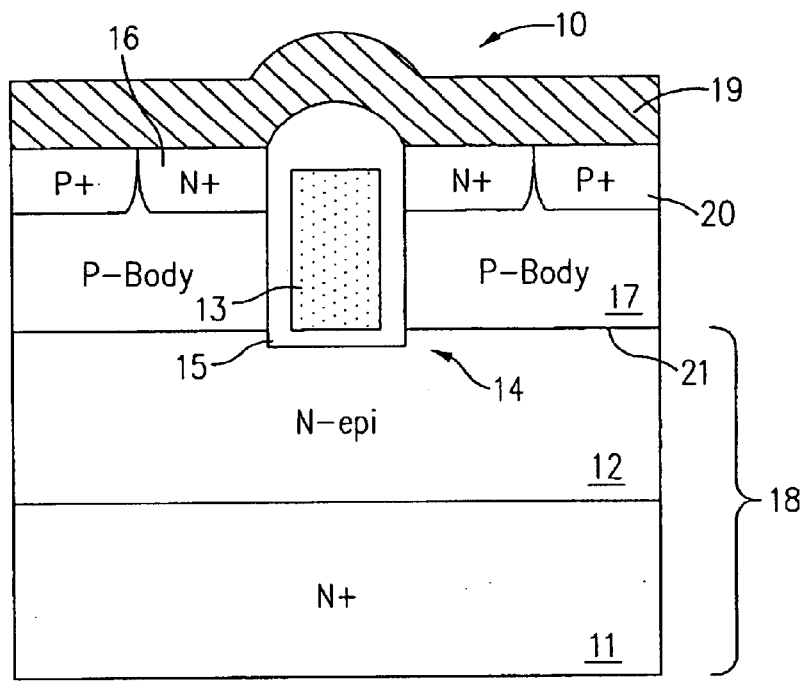
FIG. 1 is a cross-sectional view of a conventional trench-gated MOSFET.
Figure 2:
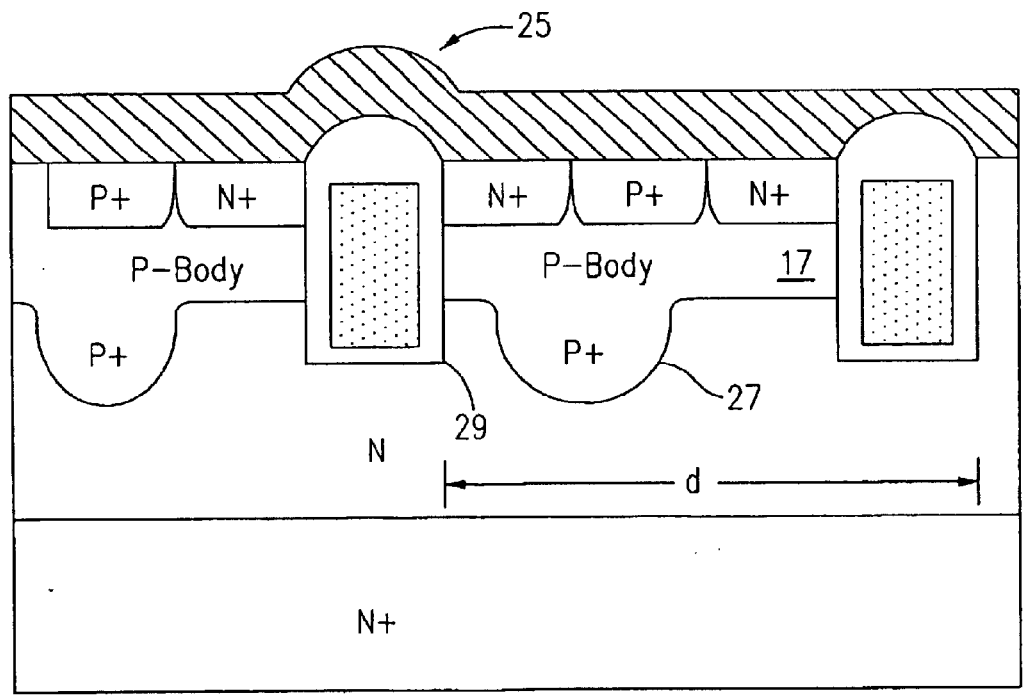
FIG. 2 is a cross-sectional view of a trench-gated MOSFET containing a deep diffusion to protect the gate oxide layer, as taught in U.S. Pat. No. 5,072,266.
Figure 3:
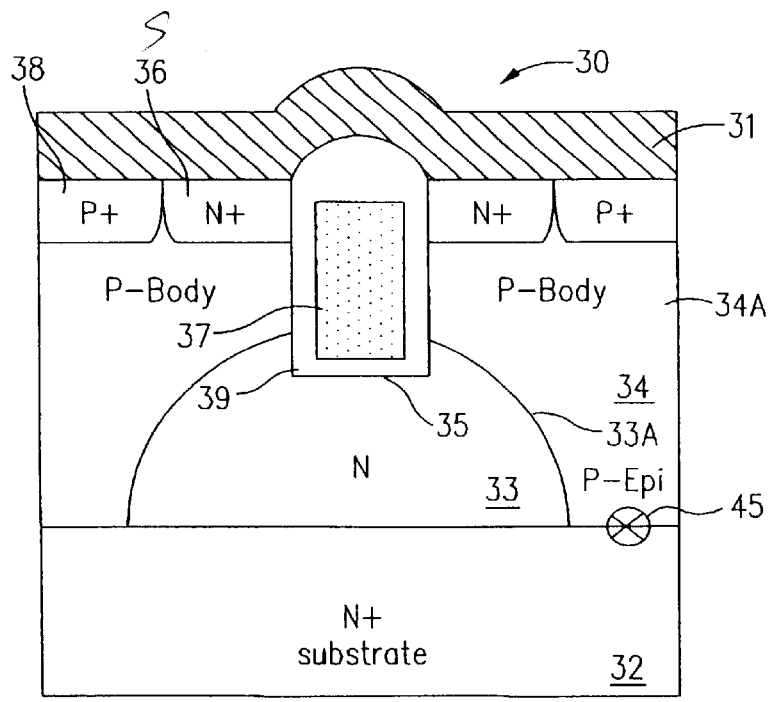
FIG. 3 is a cross-sectional view of a trench MOSFET in accordance with the invention.

A cross-sectional view of a power MOSFET in accordance with this invention is shown in FIG. 3. MOSFET 30 is formed in an N+ substrate 32 overlain by an epi layer 34, which is generally doped with a P-type impurity (hereinafter referred to as P-epi layer 34). N+ substrate 32 can have a resistivity of from $5 \times 10^{-4}$ ohm-cm to $5 \times 10^{-3}$ ohm-cm, for example, and P-epi layer 34 can be doped with boron to a concentration of from $1 \times 10^{15}$ cm$^{-3}$ to $5 \times 10^{17}$ cm$^{-3}$. N+ substrate 32 is typically about 200 microns thick and epi layer 34 could be from 2 microns to 5 microns thick.

A trench 35 is formed in P-epi layer 34 and trench 35 contains a polysilicon gate 37. Gate 37 is electrically isolated from P-epi layer 34 by an oxide layer 39 which extends along the sidewalls and bottom of the trench 35. MOSFET 30 also includes an N+ source region 36, which is adjacent a top surface of the P-epi layer 34 and a sidewall of the trench 35, and a P+ body contact region 38. The remaining portion of the P-epi layer 34 forms a P-type base or body 34A. Body 34A forms a junction with the N+ substrate 32 that is substantially coincident with the interface between the P-epi layer 34 and N+ substrate 32. A metal layer 31 makes electrical contact with N+ source region and with P body 34A through P+ body contact region 38.

Further, in accordance with this invention an N drain-drift region 33 extends between the N+ substrate 32 and the bottom of the trench 35. A junction 33A between N drain-drift region 33 and P body 34A extends between N+ substrate 32 and a sidewall of the trench 35. N drain-drift region can be doped, for example, with phosphorus to a concentration of from $5 \times 10^{15}$ cm$^{-3}$ to $5 \times 10^{17}$ cm$^{-3}$.

Figure 8A:
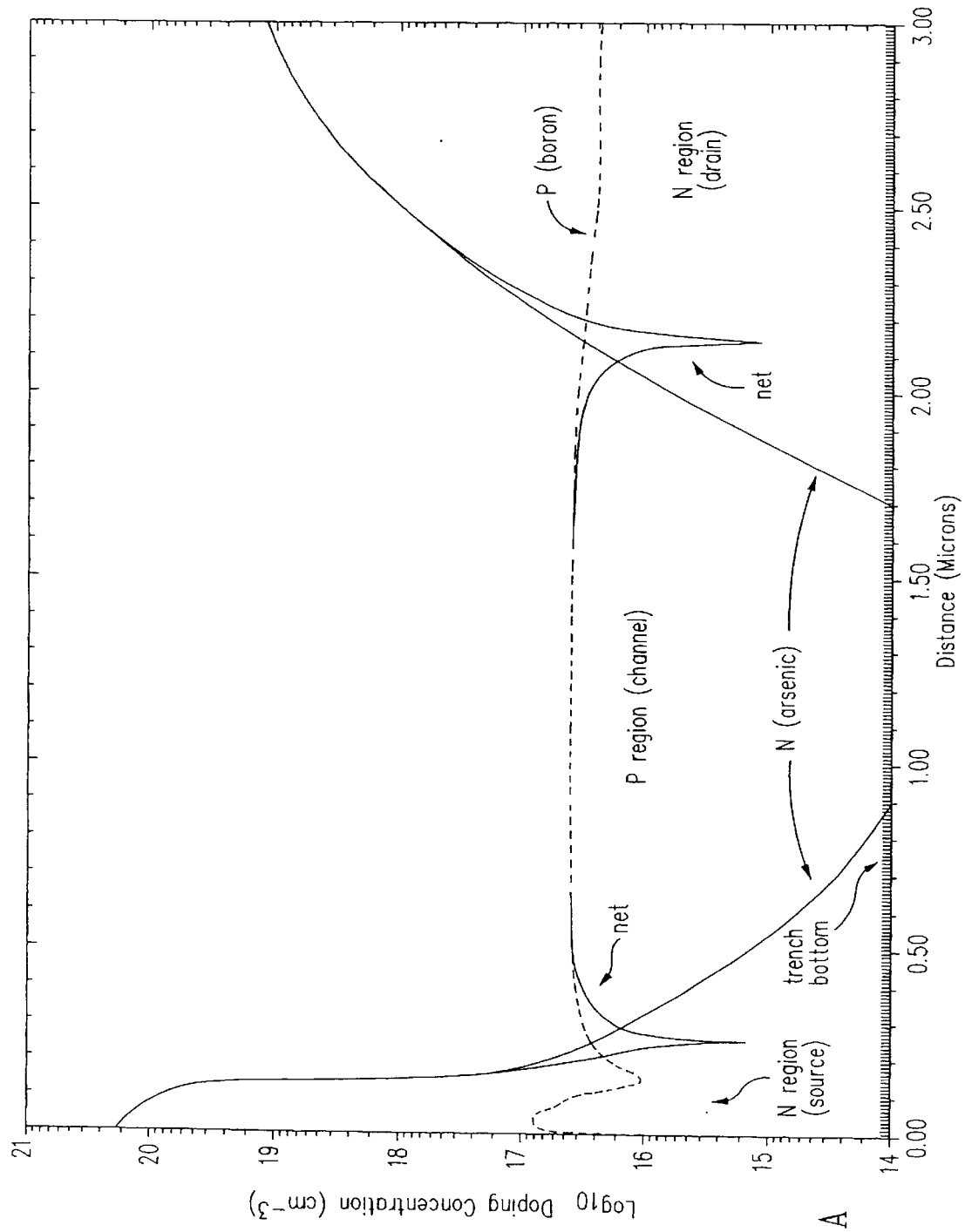
FIGS. 8A and 8B are graphs prepared using the computer simulation program SUPREME, showing the dopant concentrations in the MOSFET of FIG. 3 at vertical cross-sections through the channel region and the bottom of the trench, respectively.
Figure 8B:
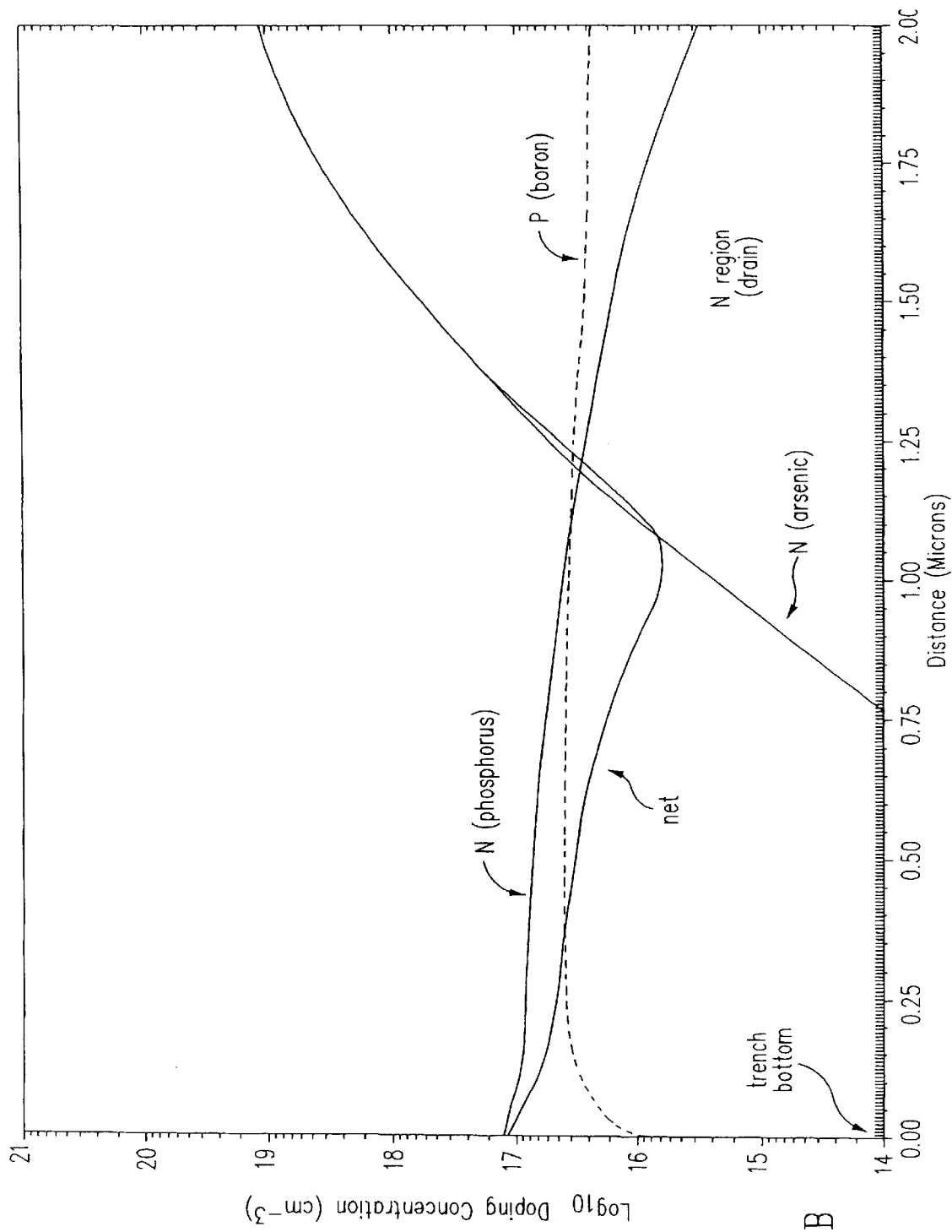

FIG. 8A is a graph of the doping concentration in MOSFET 30. The graph was prepared by the computer simulation program SUPREME and is taken at a vertical section through the channel region. The curves indicated show the doping concentrations of arsenic and boron, and the third curve shows the net doping concentration. FIG. 8B is a similar graph taken at a vertical section transecting the bottom of the trench. The horizontal axis of FIG. 8A is the distance in microns below the surface of the P-epi layer; the horizontal axis of FIG. 8B is the distance in microns below the bottom of the trench. The vertical axis of FIGS. 8A and 8B is the logarithm$_{10}$ of the doping concentration in atoms/cm$^{-3}$. Note that in FIG. 8A the concentration of boron, which is the background dopant in P-epi layer 34, is relatively flat and dominates in the channel region. The doping concentration of arsenic increases as one moves from the channel region into the source or the drain.

Figure 9A:
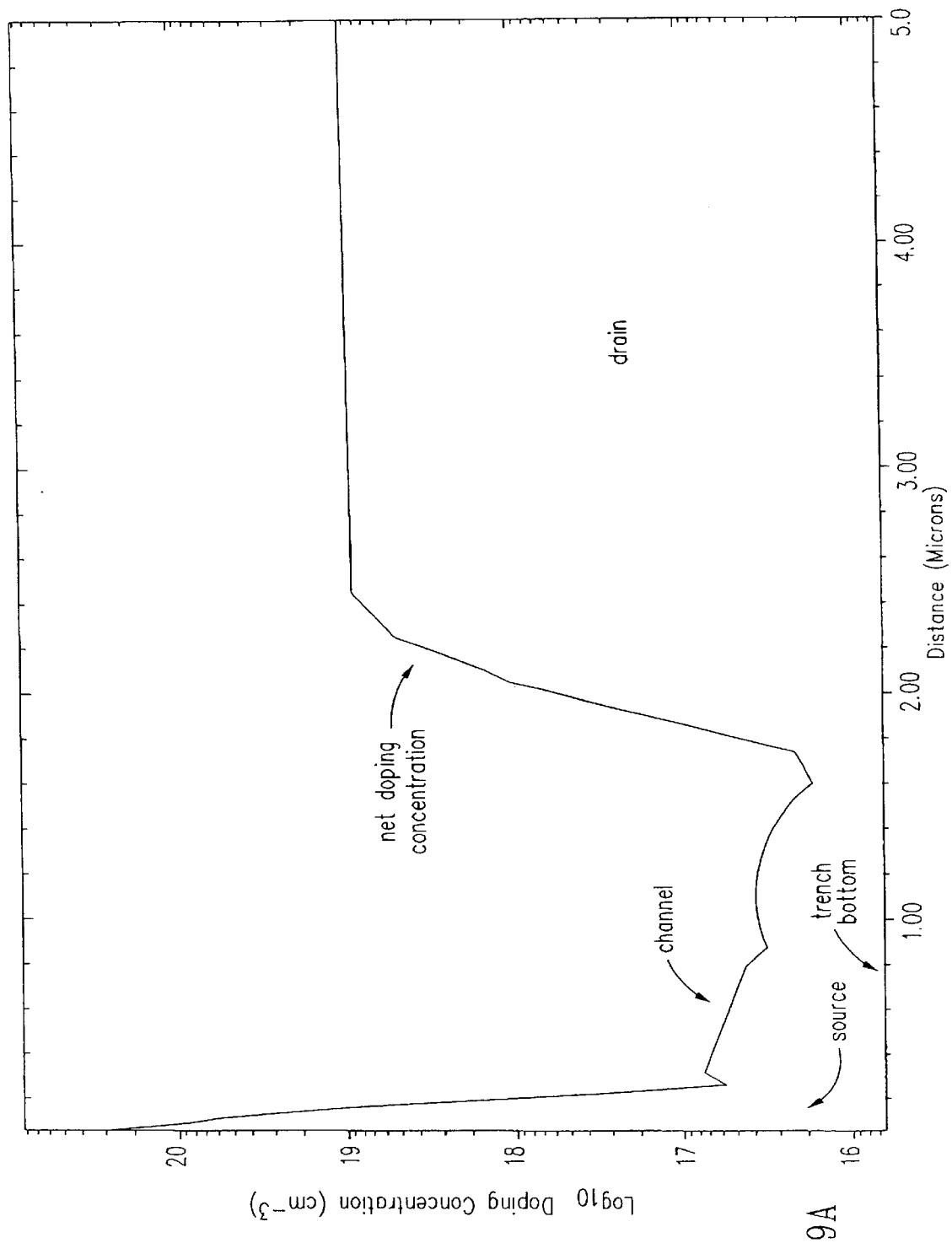
FIGS. 9A and 9B are graphs prepared using the computer simulation program MEDICI, showing the dopant concentrations in the MOSFET of FIG. 3 at vertical cross-sections through the channel region and the bottom of the trench, respectively.
Figure 9B:
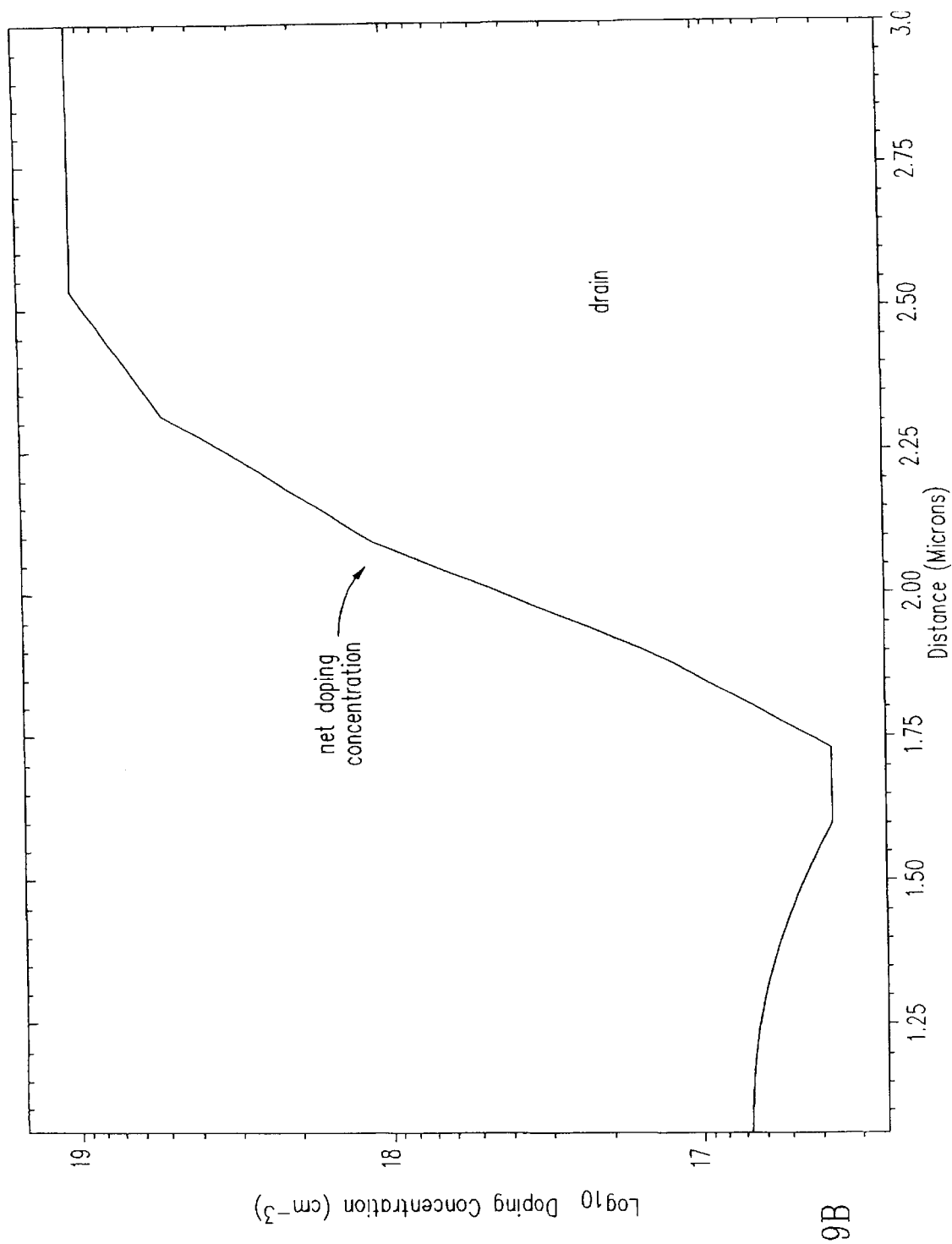

FIGS. 9A and 9B are graphs of the doping concentration at the same sections, respectively, as FIGS. 8A and 8B. FIGS. 9A and 9B, however, were prepared using the computer simulation program MEDICI and show only the net doping concentration whether N-type or P-type.

The SUPREME and MEDICI simulations differ in that SUPREME considers only the doping concentrations at a single vertical cross-section, without taking into account the effect of dopants at other laterally displaced positions, while MEDICI takes into account all dopants in the two-dimensional plane of the drawing.

Figure 10:
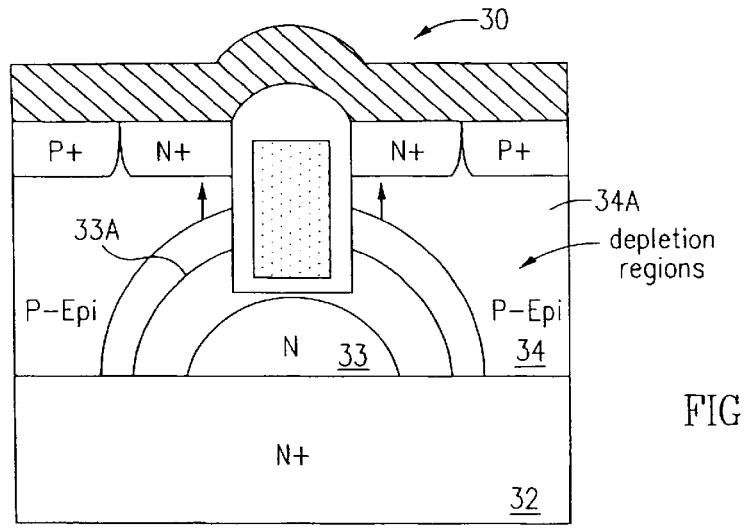
FIG. 10 illustrates the depletion regions in the MOSFET of FIG. 3 under reverse bias conditions.
Figure 11A:
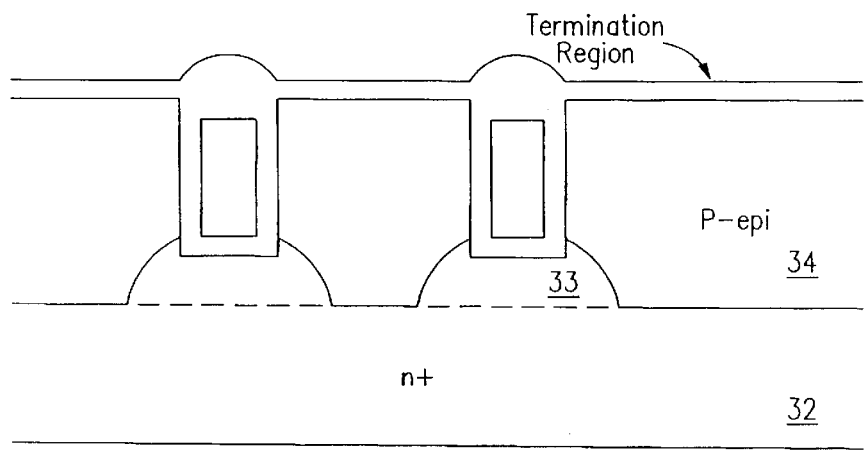
FIGS. 11A and 11B are cross-sectional views illustrating the termination region of a MOSFET according to this invention and a conventional MOSFET, respectively.
Figure 11B:
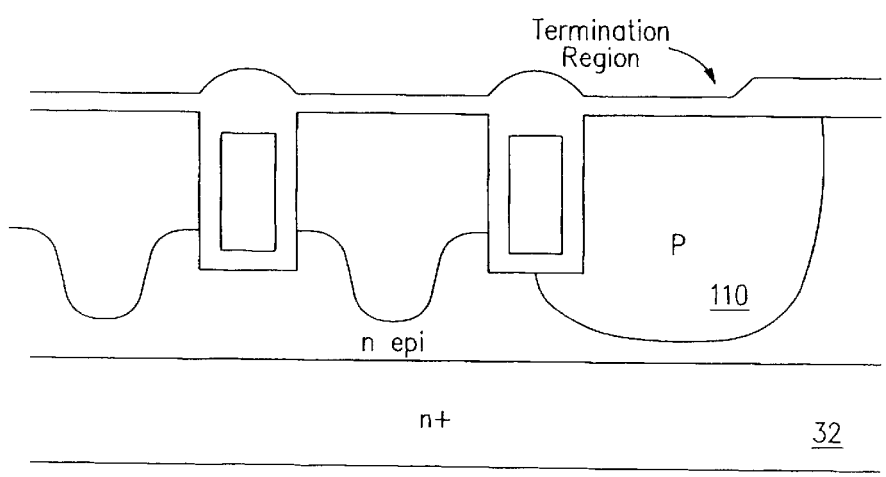
Figure 13A:
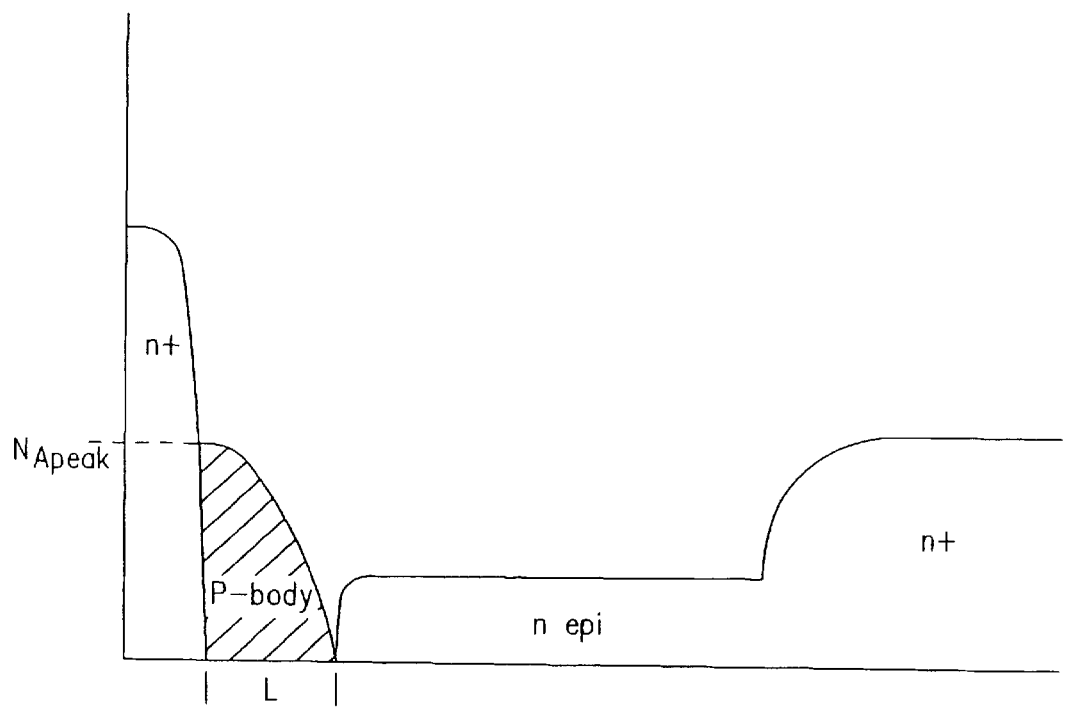
FIG. 13A is a graph of the doping profile taken at a vertical cross-section through the channel of a conventional MOSFET having a diffused P body in an N-epi region.
Figure 13B:
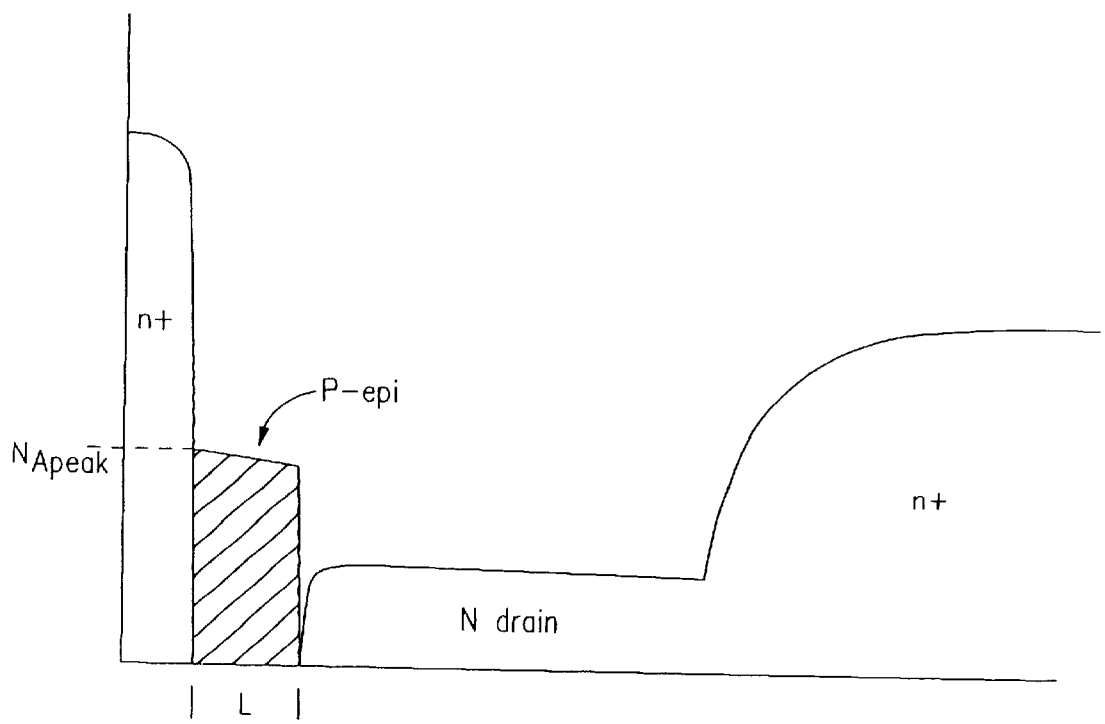
FIG. 13B is a graph of the doping profile taken at a vertical cross-section through the channel of a MOSFET according to this invention having a P-epi layer and an N drain-drift region.

The following are some of the advantages of MOSFET 30:

1. Avalanche breakdown will generally occur at the interface between the N+ substrate 32 and the P-epi layer 34, away from the trench (e.g., at the location designated 45 in FIG. 3). This avoids damage to the gate oxide layer from the hot carriers generated in the area of the breakdown.
2. The gate oxide at the corners of the trench, where the electric field reaches a maximum, is protected from rupture.
3. A higher punchthrough breakdown voltage can be obtained for a given threshold voltage. The junction between the N drain-drift region and the P body extends downward to the N+ substrate. As shown in FIG. 10, when the MOSFET is reverse-biased the depletion regions extend along the entire junction, and as a result the depletion region in the area of the channel does not expand as quickly towards the source region (see arrows). This is the condition that causes punchthrough breakdown.
4. For another reason, a higher punchthrough breakdown voltage can be obtained for a given threshold voltage. As shown in FIG. 13A, in a conventional MOSFET having a diffused body, the dopant concentration of the body falls off gradually as one approaches the N-epi (drift region). The threshold voltage is determined by the peak doping concentration $N_{A\ peak}$. The punchthrough breakdown voltage is determined by the total amount of charge $Q_{channel}$ in the channel region (represented by the area under the P body curve in FIG. 13A). In a MOSFET of this invention, a doping profile of which is shown in FIG. 13B, the dopant profile of the P-epi layer is relatively flat. Therefore, $N_{A\ peak}$ can be the same while the total charge in the channel is greater, providing a higher punchthrough breakdown voltage.
5. Since there is no deep body diffusion in each cell (of the kind taught in the Bulucea patent) the cell pitch can be reduced without concern that additional P-type dopant will get into the channel region, raising the threshold voltage of the MOSFET. Thus the cell packing density can be increased. This reduces the on-resistance of the device.
6. In a conventional trench MOSFET a lightly-doped "drift region" is often formed between the channel and the heavily-doped substrate. The doping concentration in the drift region must be kept below a certain level because otherwise effective depletion is not obtained and the strength of the electric field at the corner of the trench becomes too great. Keeping the doping concentration in the drift region low increases the on-resistance of the device. In contrast, the N drain-drift region 33 of this invention can be doped more heavily because the shape of N drain-drift region 33 and the length of the junction between N drain-drift region 33 and P body 34A provide more effective depletion. A more heavily doped N drain-drift region 33 reduces the on-resistance of the device.
7. As shown in FIG. 11A, there is no need for a separate P-type diffusion in the termination region of the MOSFET, since the P-epi layer extends to the N+ substrate except where the N drain regions are located. FIG. 11B shows the termination region of a conventional MOSFET which includes a P-type diffusion 110. The elimination of the P-type termination diffusion or field ring reduces the number of masking steps. For example, as described below, the process illustrated in FIGS. 5A–5L requires only five masking steps.

Figure 4:
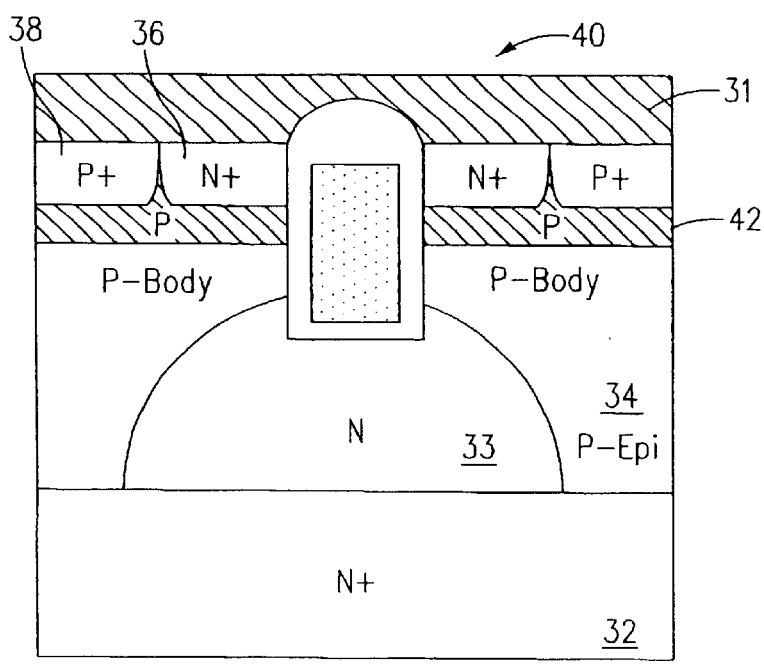
FIG. 4 is a cross-sectional view of a trench MOSFET in accordance with the invention containing a threshold adjust implant.

MOSFET 40, shown in FIG. 4, is an alternative embodiment which is similar to MOSFET 30 except that MOSFET 40 contains a threshold voltage adjust implant 42. Illustratively, such an implant could increase the threshold voltage of MOSFET 40 from 0.6 V to 1.0 V.

FIGS. 5A–5L illustrate the steps of forming MOSFETs 30 and 40. It should be noted that these figures are not necessarily drawn to scale.

Figure 5A:
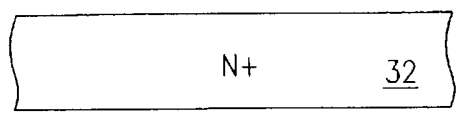
FIGS. 5A–5L are cross-sectional views illustrating a process of fabricating the MOSFETs of FIGS. 3 and 4.
Figure 5D:
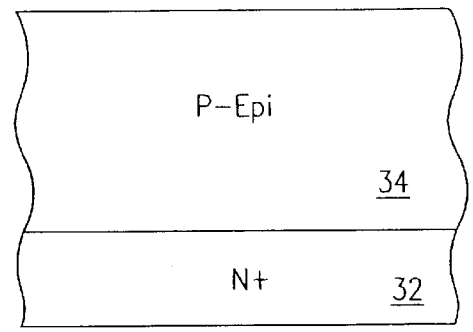
Figure 5B:
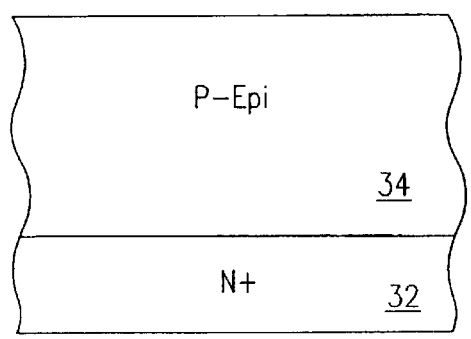
Figure 5E:
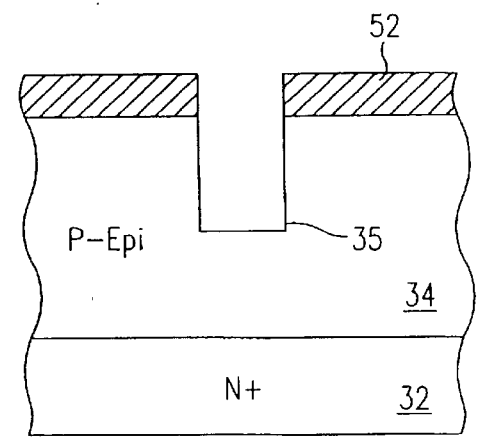
Figure 5C:
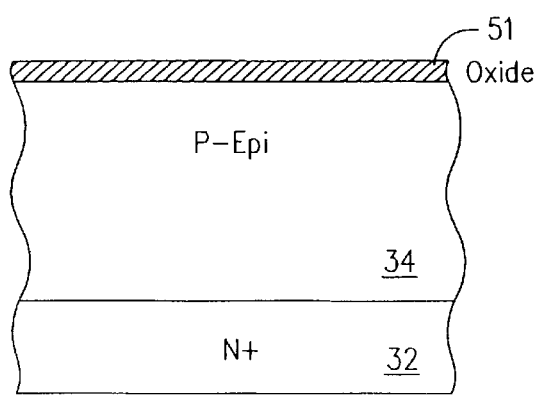

The process begins with N+ substrate 32 (FIG. 5A), on which P-epi layer 34 is grown by a well known process (FIG. 5B). A thin oxide layer 51 is then grown on the surface of P-epi layer 34 by heating in steam at 1150° C. for about 50 minutes (FIG. 5C). Oxide layer 51 is masked and removed from the "active area" of the device (i.e., from the area where the active MOSFET cells are to be located) and it is left in the termination and gate pad areas (FIG. 5D).

A photoresist mask 52 is then formed on the surface of P-epi layer 34, and trench 35 is formed by a reactive ion etch (RIE) process. The process is terminated before the bottom of the trench reaches N+ substrate 32 (FIG. 5E).

Figure 5F:
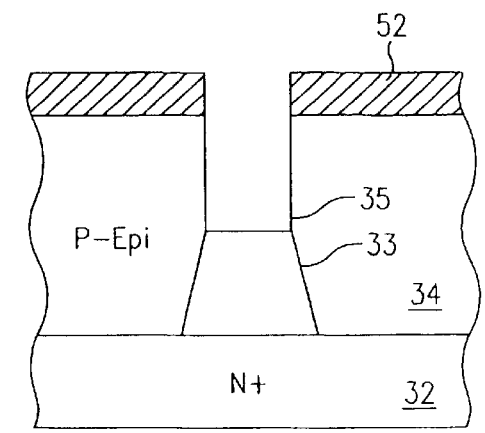

Leaving photoresist mask 52 in place, phosphorus is implanted through the bottom of trench 35 at a dose of $1 \times 10^{13}$ cm$^{-2}$ to $1 \times 10^{14}$ cm$^{-2}$ and an energy of 100 keV to 2.0 MeV to produce N drain-drift region 33 (FIG. 5F). To avoid significant diffusion of the phosphorus and the consequent expansion of N drain-drift region 33, the thermal budget to which the structure is thereafter exposed is limited to the equivalent of about 950° C. for 60 minutes, or the structure can be subjected to a rapid thermal anneal (RTA) at 1050° C. for 90 seconds. In either case, N drain-drift region 33 retains essentially the compact shape shown in FIG. 5F. Advantageously, in the cross-sectional view of FIG. 5F, at least 75% and preferably 90% of the N drain-drift region 33 is located directly below the trench 35.

Alternatively, N drain-drift region 33 can be formed by implanting the phosphorus at a lower energy of 30 keV to 300 keV (typically 150 keV) to a level just below the bottom of the trench, and diffusing the phosphorus by heating at 1050° C. to 1150° C. for 10 minutes to 120 minutes (typically 1100° C. for 90 minutes), so that N drain-drift region 33 expands downward and laterally to a shape of the kind shown in FIG. 5G.

Figure 15A:
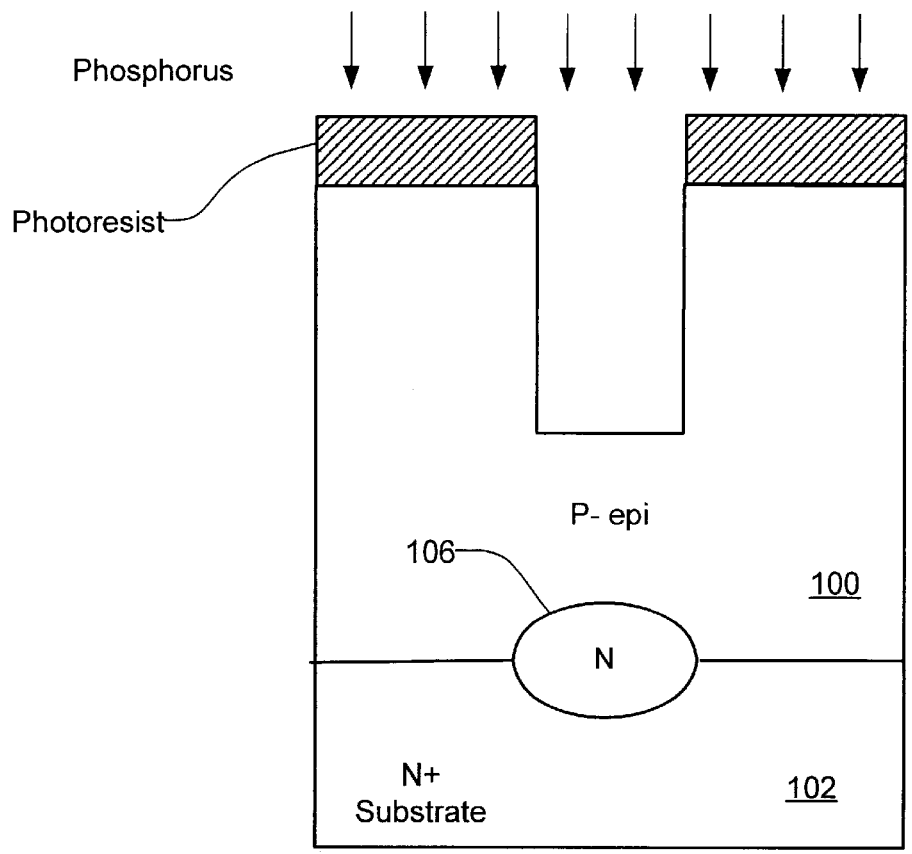
FIGS. 15A and 15B illustrate a process in which a drain dopant is implanted to form a deep layer near the interface between the epi layer and the substrate and then up-diffused until it reaches the bottom of the trench.
Figure 15B:
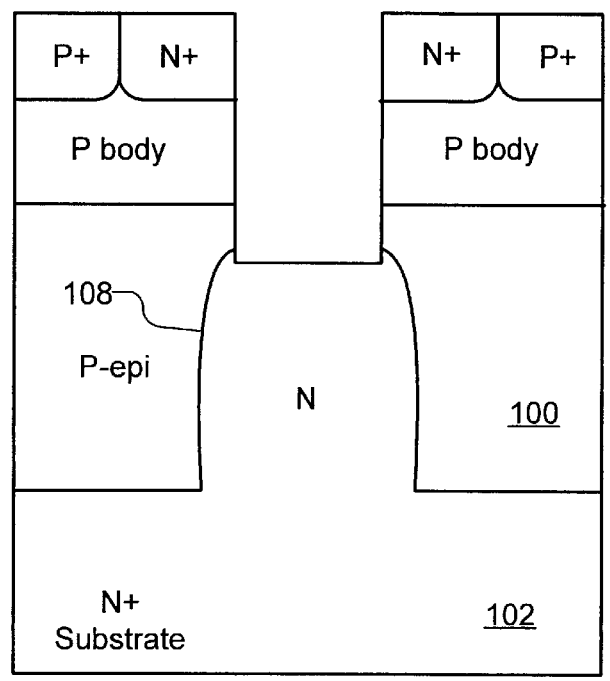

In another variant of the process, a deep layer 106 can be formed by implanting phosphorus at a relatively high energy (e.g., 300 keV to 3 MeV) and at a dose of $1 \times 10^{12}$ to $1 \times 10^{14}$ cm$^{-2}$, for example, to a level below the trench, as shown in FIG. 15A, and a thermal process (e.g., 900 to 1100° C.) can be used to up-diffuse the phosphorus until it reaches the bottom of the trench. This yields a drain-drift region 108, as shown in FIG. 15B. This is distinguishable from the process described above in conjunction with FIG. 5F, where after the implant the dopant extends from the bottom of the trench to the interface between the N+ substrate and the P-epi layer, or in conjunction with FIG. 5G, where after the implant the dopant lies just below the bottom of the trench. When the N-type dopant is implanted at a relatively high energy to form deep layer 106, variations in the depth of the trench, the thickness of the P-epi layer 100, and the implant energy may cause layer 106 to be located either above the interface (e.g., if P-epi layer 100 is thick and/or the trench depth is small) or in N+ substrate 102 (e.g., if P-epi layer 100 is thin and/or the trench depth is large).

Figure 16:
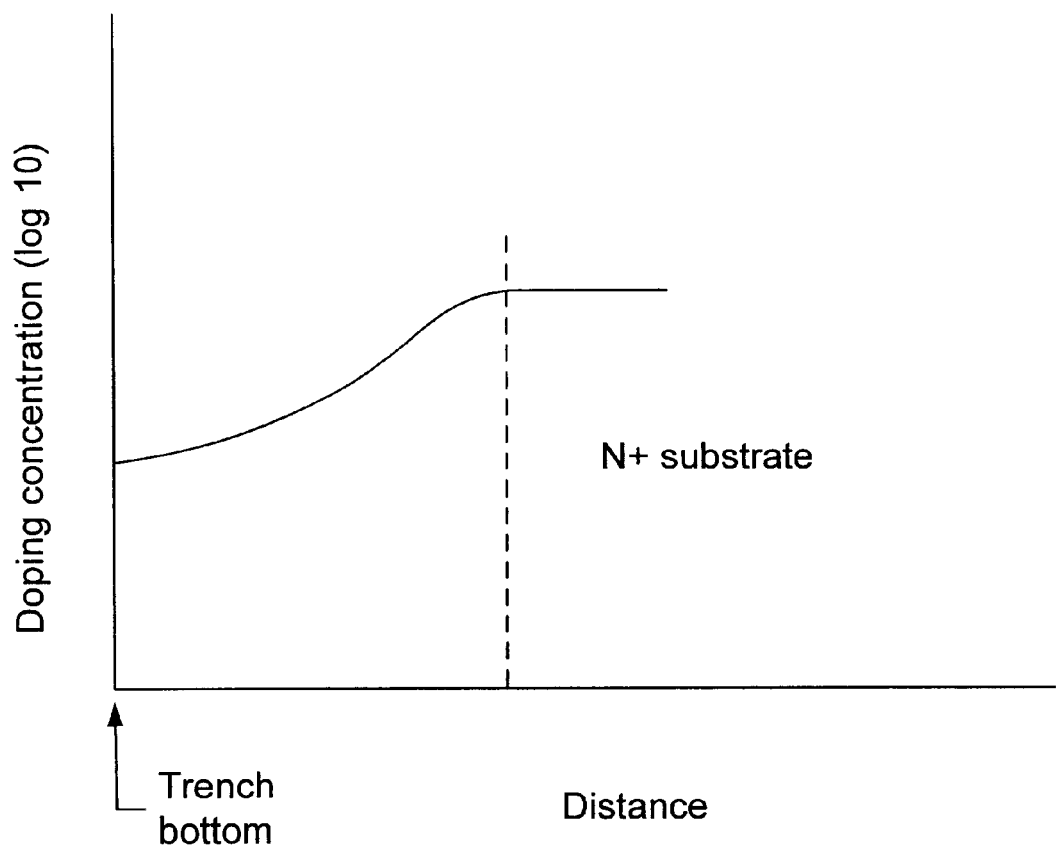
FIG. 16 shows the general shape of the doping profile in a vertical cross-section below the trench when the drain-drift region is formed by implanting a deep layer and up-diffusing the deep layer.

FIG. 16 shows the general shape of the doping profile of drain-drift region 108 in a vertical cross-section starting at the bottom of the trench. As indicated, the concentration of N-type dopant in the drain-drift region increases monotonically with increasing distance below the bottom of the trench. This is distinguishable from the doping profile below the trench in a MOSFET formed using the low-energy process, as shown in FIG. 9B, where the doping concentration initially decreases below the trench bottom and then increases in the vicinity of the N+ substrate.

Using the high energy process and up-diffusing the N-type dopant from an deep implanted layer results in an N drain-drift region that is confined largely to the area directly below the trench and allows a smaller cell pitch. It also is easier to control and provides greater throughput.

Figure 17A:
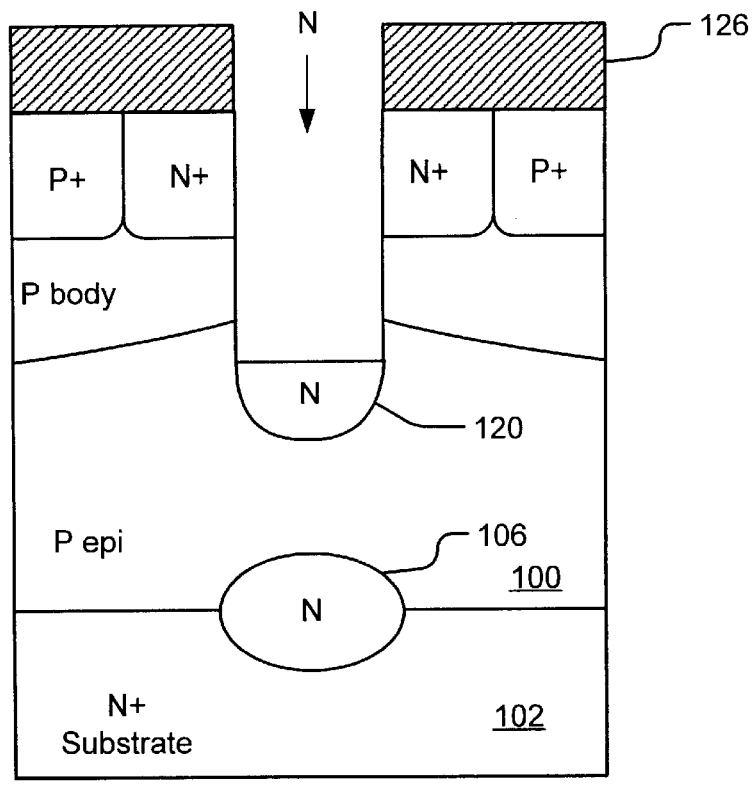
FIGS. 17A and 17B illustrate a process of forming a drain-drift region that includes an up-diffusion from a deep implanted layer and a down-diffusion from an implanted region below the bottom of the trench.
Figure 17B:
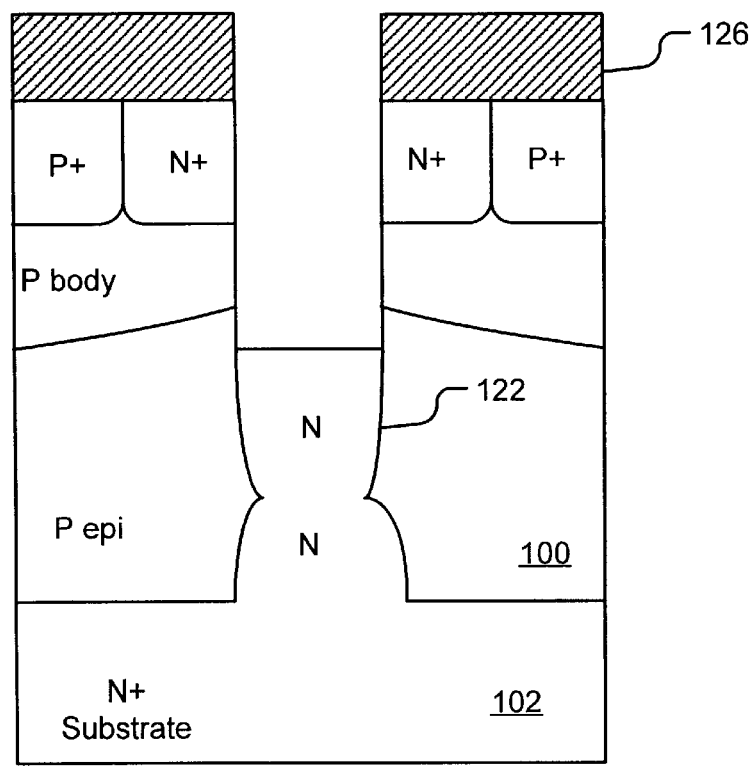

Alternatively, a combination up-diffusion, down-diffusion process can be used to form the drain-drift region. As shown in FIG. 17A, deep N layer 106 (e.g., phosphorus) is formed at the interface of N+ substrate 102 and P epi layer 100 by a high-energy implant process, as described above. An N-type dopant is implanted through the bottom of the trench at a lower energy to form an N region 120. Preferably, the implants are made through an opening in the mask layer 126 that is used to form the trench. The structure is then heated, for example, to 900° C. Deep N layer 106 diffuses upward and N region 120 diffuses downward until they merge, forming N-type drain-drift region 122, as shown in FIG. 17B.

Figure 18:
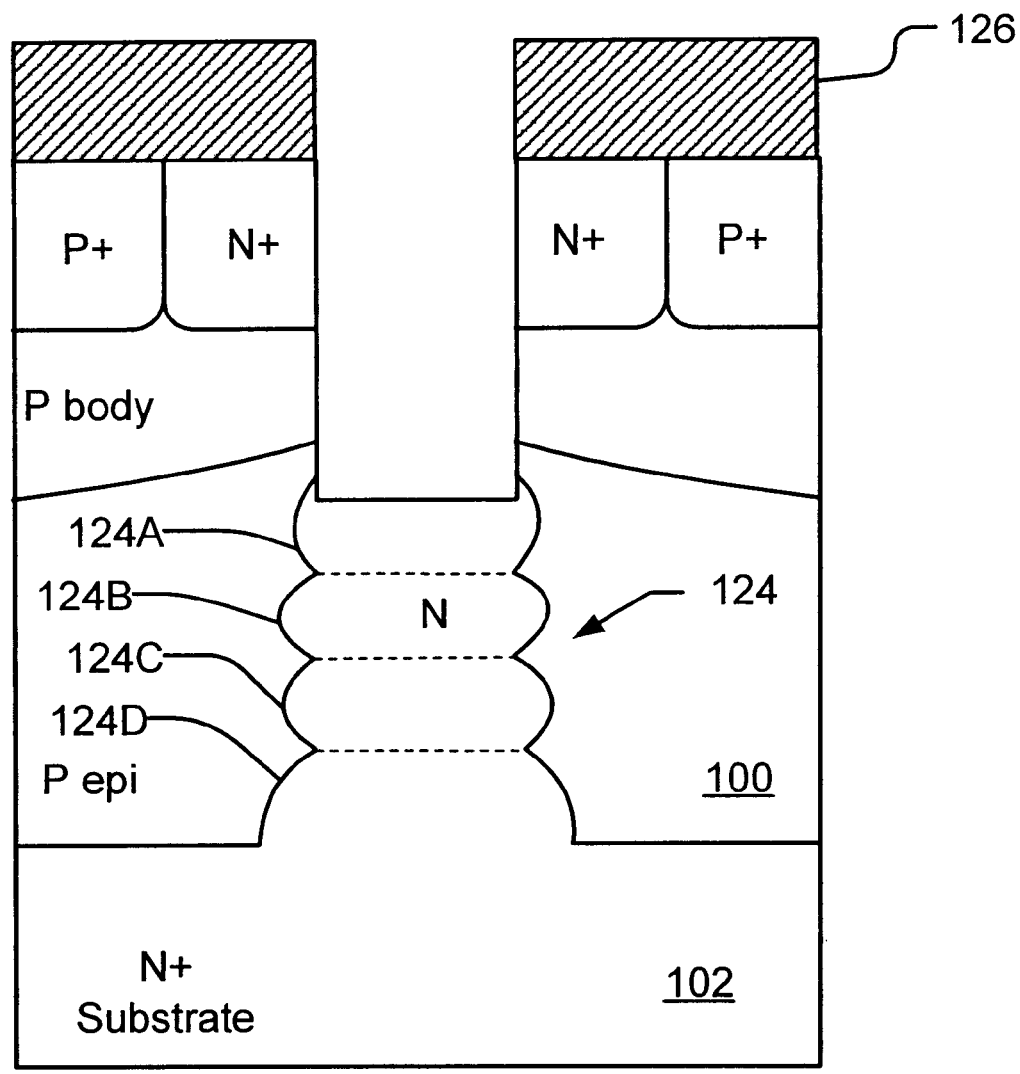
FIG. 18 shows an embodiment wherein the drain-drift region includes a stack of implanted regions.

Yet another alternative is to form the drain-drift region with a series of three or more N implants at successively greater energies to form a stack of overlapping implanted regions 124 as shown in FIG. 18. The stack 124 includes four implanted regions 124A–124D, but fewer or more than four implants could also be used to form the stack. The stack could be formed with essentially no diffusions (i.e., no heating), or it could be heated to diffuse the dopant and increase the amount of overlap between the regions 124A–124D.

At the conclusion of the process, whether high energy or low energy, the N drain-drift region extends from N+ substrate 32 to the bottom of trench 35. In many cases, the PN junction between the drain-drift region and P body 34A extends from N+ substrate 32 to a sidewall of trench 35 and will be in the form of an arc that is concave towards the drain-drift region (FIG. 5G).

Figure 5G:
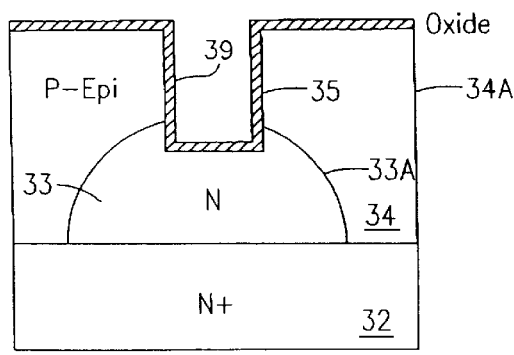
Figure 5J:
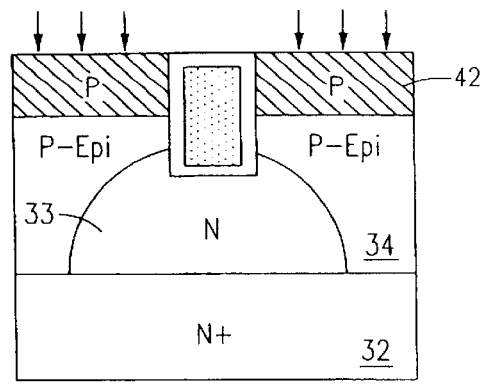

Continuing with the description of the process, as shown in FIG. 5G, a gate oxide layer 39 is then grown on the surface of P-epi layer 34 and on the bottom and sidewalls of trench 35, typically to a thickness of about 500 Å.

Figure 5H:
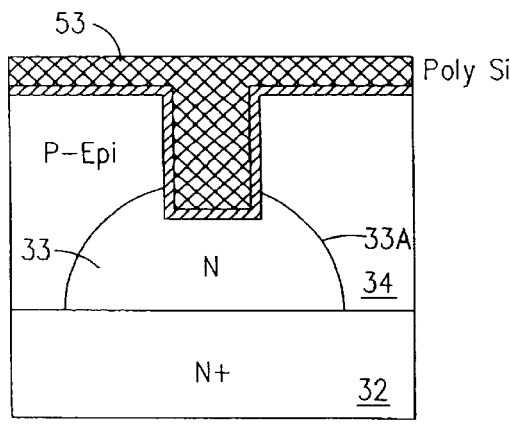

A polysilicon layer 53 is then deposited over the gate oxide layer 39, filling the trench 35 (FIG. 5H). In an N-channel MOSFET polysilicon layer 53 is typically doped with phosphorus to a concentration of $5 \times 10^{19}$ cm$^{-3}$.

Polysilicon layer 53 is etched back so that its top surface is substantially coplanar with the surface of P-epi layer 34. An oxide layer 54 is formed on the top of the gate by thermal oxidation or deposition (FIG. 5I).

Figure 12A:
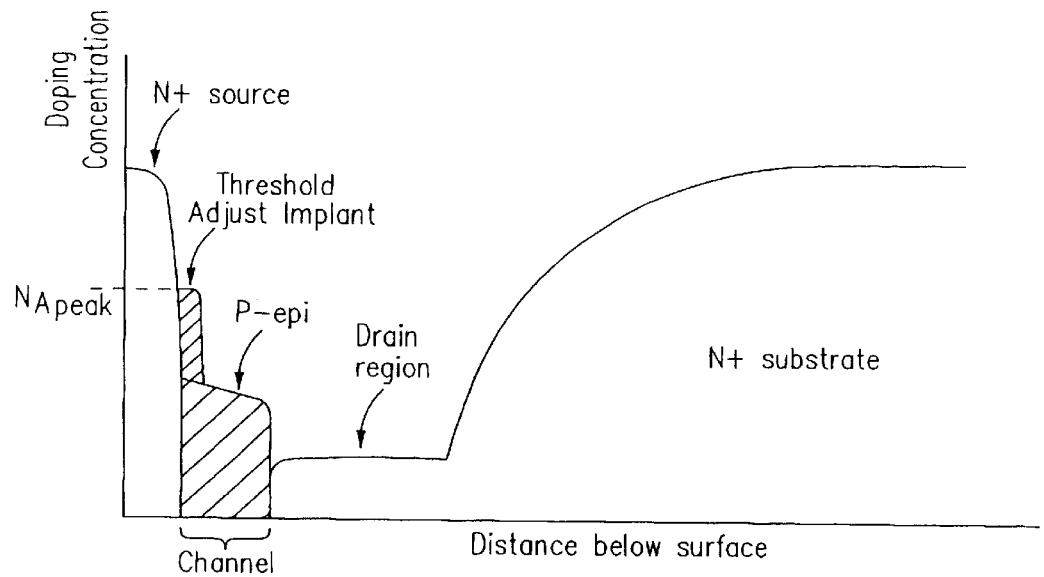
FIGS. 12A and 12B are doping profile graphs illustrating a threshold adjust implant and a body implant, respectively.

Optionally, if the threshold voltage is to be adjusted, threshold voltage adjust implant 42 is formed. Implant 42 is formed, for example, by implanting boron through the surface of P-epi layer 34 (FIG. 5J) at a dose of $5 \times 10^{12}$ cm$^{-2}$ and at an energy of 150 keV, yielding a concentration of P-type atoms of $1 \times 10^{17}$ cm$^{-3}$ in the portion of P-epi layer 34 which will form the channel of the MOSFET. FIG. 12A is a graph showing a dopant profile of a vertical cross-section taken through the channel, showing a threshold adjust implant and indicating that the threshold adjust implant is typically located in an area of the channel just below the source region. The threshold voltage of the MOSFET is determined by the peak doping concentration $N_{A\,peak}$ of the threshold adjust implant. If the threshold voltage of the device does not need to be adjusted, this step can be omitted.

Figure 12B:
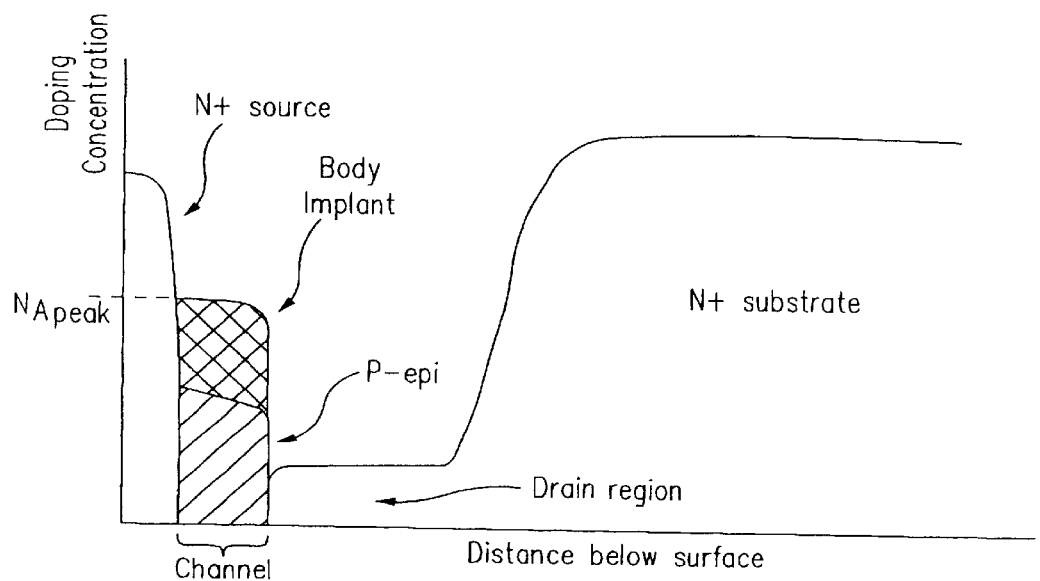

Alternatively, a body implant can be performed, as illustrated in the graph of FIG. 12B. The body implant is somewhat similar to the threshold adjust implant but the energy used is higher and as a result the body implant extends to a level near the junction between the P-epi layer and the N drain-drift region. The threshold voltage of the MOSFET is determined by the peak doping concentration $N_{A\,peak}$ of the body implant.

Figure 14A:
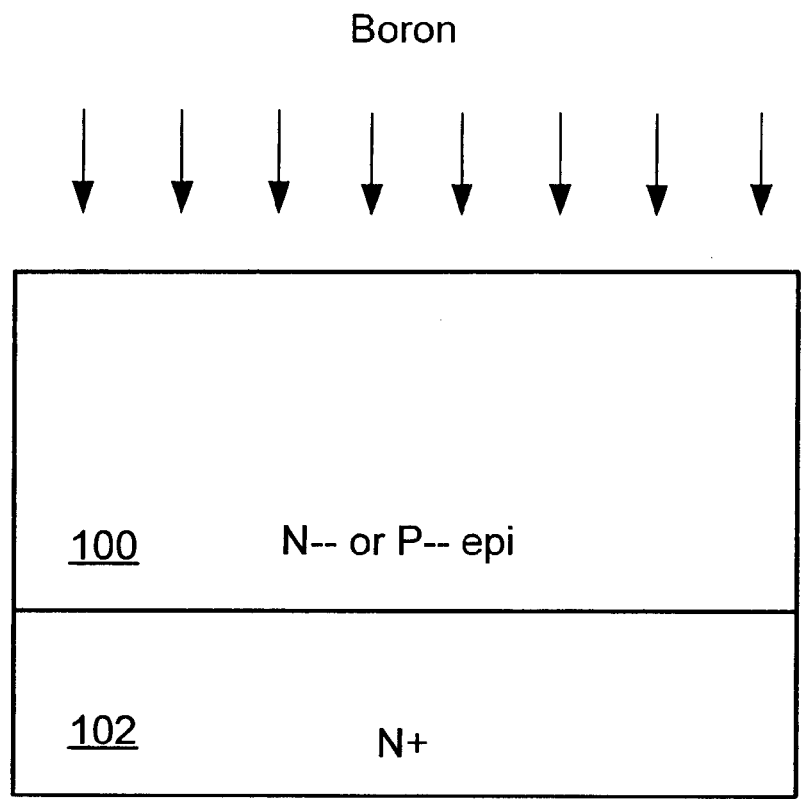
FIGS. 14A and 14B illustrate a process in which a body dopant is implanted and driven in until it reaches the interface between the epi layer and the substrate.
Figure 14B:
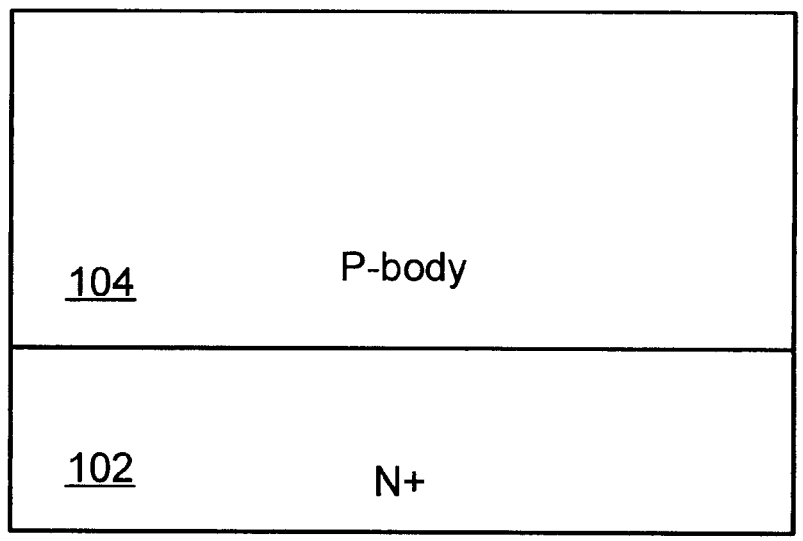

In another embodiment, a P-type impurity such as boron is implanted as a body dopant and is driven in until the dopant reaches the interface between the epi layer and the substrate. Such an embodiment is illustrated in FIGS. 14A and 14B. Epi layer 100 may be lightly doped with either N-type or P-type impurity. As shown in FIG. 14B, when the boron has been implanted and diffused, a P body region 104 is formed on the N+ substrate 102. Alternatively, the P body diffusion may be driven to a level below the bottom of the trench but above the interface between the epi layer and the substrate, as evidenced by P body 128 in FIG. 19.

Figure 19:
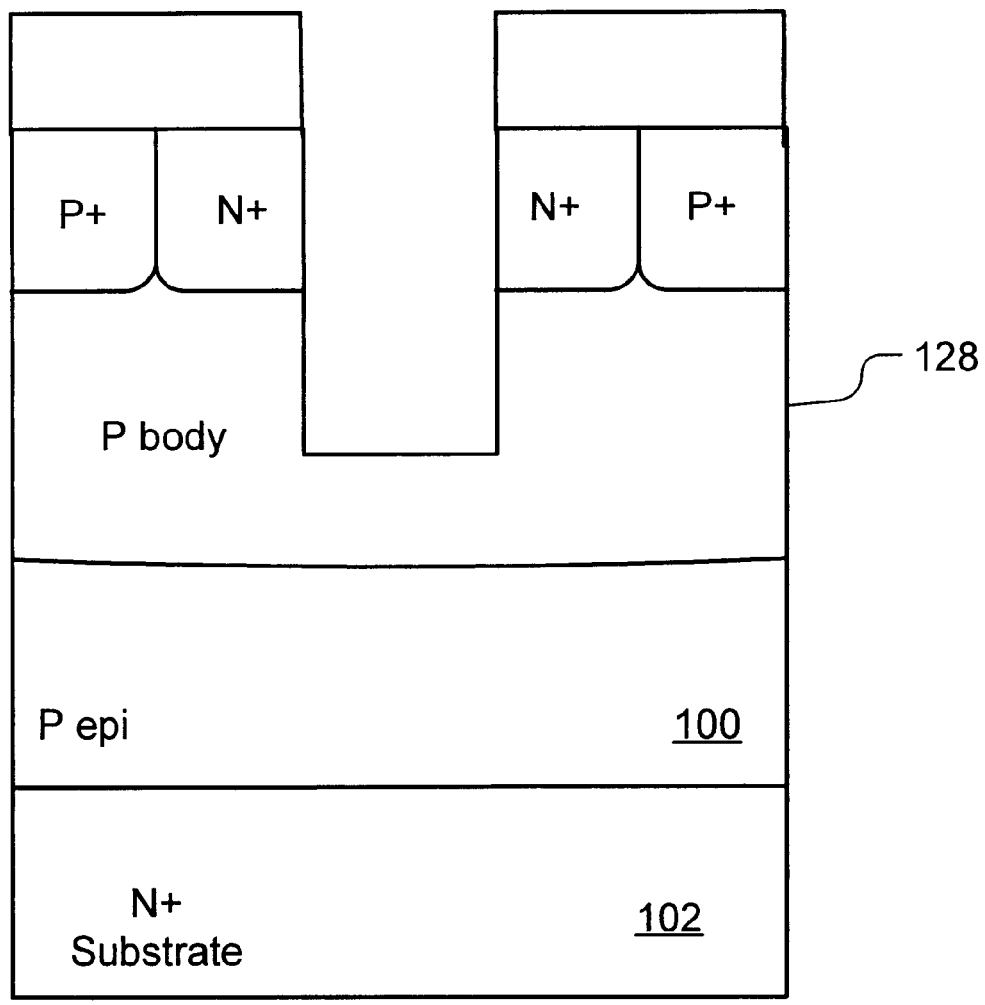
FIG. 19 shows an embodiment wherein a P body region is driven in to a level below the bottom of the trench but above the interface between the epi layer and the substrate.

The structures containing P body 104 as shown in FIG. 14B, or P body 128 as shown in FIG. 19, can be used in all of the processes for forming a drain-drift region described herein. That includes the process shown in FIGS. 15A and 15B, involving the up-diffusion of a deep implanted layer; the process shown in FIGS. 17A and 17B, involving the up-diffusion of a deep implanted layer and the down diffusion of an implanted region below the bottom of the trench; and the process shown in FIG. 18, involving the implanting of multiple N-type regions at different energies to form a stack of overlapping regions.

Figure 5K:
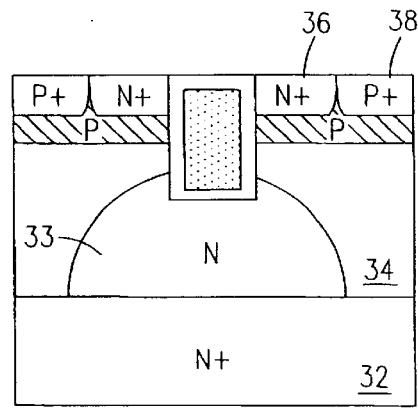
Figure 5I:
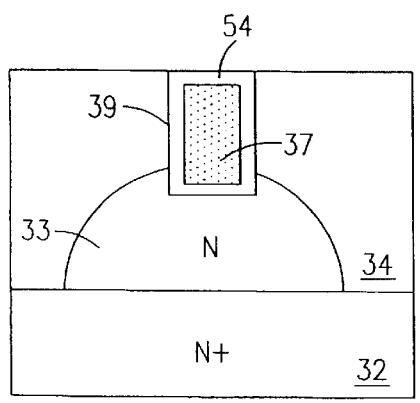
Figure 5L:
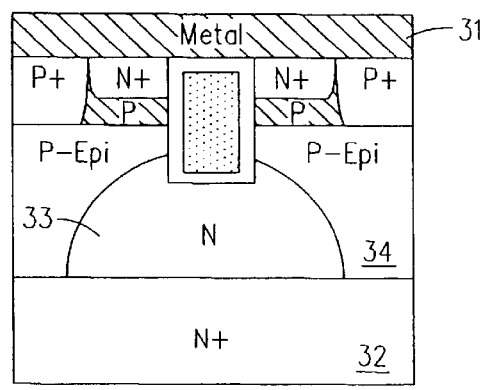

Next, N+ source regions 36 and P+ body contact regions 38 are formed at the surface of P-epi layer 34, using conventional masking and photolithographic processes (FIG. 5K). For example, N+ source regions can be implanted with arsenic at a dose of $5 \times 10^{15}$ cm$^{-2}$ and an energy of 80 keV, yielding a concentration of $1 \times 10^{20}$ cm$^{-3}$; P+ body contact regions 38 can be implanted with boron at a dose of $1 \times 10^{15}$ cm$^{-2}$ and an energy of 60 keV, yielding a dopant concentration of $5 \times 10^{19}$ cm$^{-3}$.

Finally, metal layer 31, preferably aluminum, is deposited on the surface of P-epi layer 34 in ohmic contact with N+ source regions 36 and P+ body contact regions 38.

Figure 6:
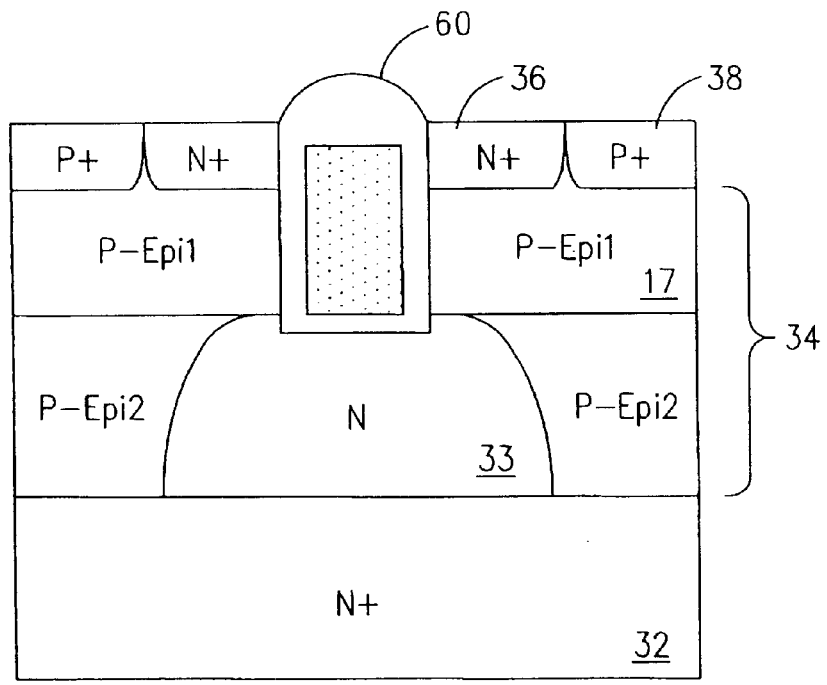
FIG. 6 is a cross-sectional view of a trench MOSFET in accordance with the invention formed in stepped epitaxial layer.

FIG. 6 shows another alternative embodiment. MOSFET 60 is similar to MOSFET 30, but P-epi layer 34 is divided into sublayers Pepi1 and Pepi2. Using a well-known process, an epi layer having sublayers can be formed by varying the flow rate of the dopant gas while the epi layer is being grown. Alternatively, sublayer Pepi1 can be formed by implanting dopant into the upper portion of the epi layer 34.

The dopant concentration of sublayer Pepi1 can be either greater than or less than the dopant concentration of sublayer Pepi2. The threshold voltage and punchthrough breakdown of the MOSFET are a function of the doping concentration of sublayer Pepi1, while the avalanche breakdown voltage and on-resistance of the MOSFET are a function of the doping concentration of sublayer Pepi2. Thus, in a MOSFET of this embodiment the threshold voltage and punchthrough breakdown voltage can be designed independently of the avalanche breakdown voltage and on-resistance. P-epi layer 34 may include more than two sublayers having different doping concentrations.

Figure 7:
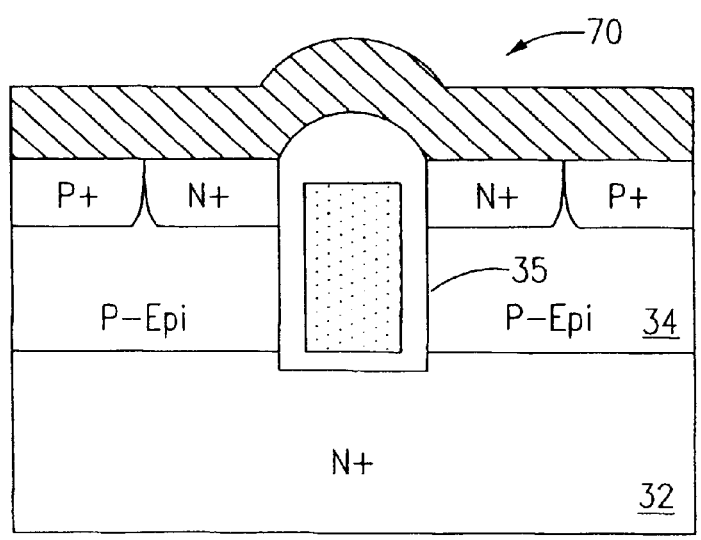
FIG. 7 is a cross-sectional view of a trench MOSFET in accordance with the invention wherein the trench extends into the heavily-doped substrate.

FIG. 7 shows another alternative embodiment. In MOSFET 70 drain-drift region 33 is omitted, and trench 35 extends entirely through P-epi layer 34 into N+ substrate 32. This embodiment is particularly suitable for low-voltage (e.g., 5 V or less) MOSFETs.

While several specific embodiments of this invention have been described, these embodiments are illustrative only. It will be understood by those skilled in the art that numerous additional embodiments may be fabricated in accordance with the broad principles of this invention. For example, while the embodiments described above are N-channel MOSFETs, a P-channel MOSFET may be fabricated in accordance with this invention by reversing the conductivities of the various regions in the MOSFET.

I claim:

1. A process of fabricating a power MOSFET comprising:
   providing a substrate of a first conductivity type;
   providing an epitaxial layer of a second conductivity type opposite to said first conductivity type on the substrate;
   forming a trench in the epitaxial layer;
   implanting dopant of said first conductivity type through a bottom of the trench to form a drain-drift region beneath said trench and within said epitaxial layer, immediately following said implanting said drain-drift region extending from said trench to said substrate;
   forming an insulating layer along the bottom and a sidewall of the trench;
   introducing a conductive gate material into the trench; and
   introducing dopant of the first conductivity type into the epitaxial layer to form a source region, the drain-drift region and the source region being formed under conditions such that the source region and drain-drift region are separated by a channel region of the epitaxial layer adjacent the sidewall of the trench.

2. The process of claim 1 wherein providing an epitaxial layer comprises growing an epitaxial layer of the second conductivity type on the substrate.

3. The process of claim 1 wherein providing an epitaxial layer comprises growing an epitaxial layer of said first conductivity type and implanting dopant of a second conductivity type opposite to said first conductivity type into said epitaxial layer.

4. The process of claim 3 comprising heating said epitaxial layer so as to diffuse said dopant of said second conductivity type to an interface between said epitaxial layer and said substrate.

5. The process of claim 1 comprising implanting dopant of said second conductivity type into said epitaxial layer to form a body region.

6. The process of claim 7 wherein implanting dopant of said first conductivity type through a bottom of the trench to form a drain-drift region comprises implanting dopant at an energy of from 100 keV to 2.0 MeV.

7. A process of fabricating a power MOSFET comprising:
   providing a substrate of a first conductivity type;
   providing an epitaxial layer of a second conductivity type opposite to said first conductivity type on the substrate;
   forming a trench in the epitaxial layer;
   implanting dopant of said first conductivity type through a bottom of the trench to form a region of dopant beneath said trench and within said epitaxial layer, said region of dopant being located above and separated from said substrate;
   heating said substrate so as to cause said region of dopant to diffuse downward so as to form a drift-drain region extending from said bottom of said trench to said substrate;
   forming an insulating layer along the bottom and a sidewall of the trench;
   introducing a conductive gate material into the trench; and
   introducing dopant of the first conductivity type into the epitaxial layer to form a source region, the drain-drift region and the source region being formed under conditions such that the source region and drain-drift region are separated by a channel region of the epitaxial layer adjacent the sidewall of the trench.

8. The process of claim 7 wherein providing an epitaxial layer comprises growing an epitaxial layer of the second conductivity type on the substrate.

9. The process of claim 7 wherein providing an epitaxial layer comprises growing an epitaxial layer of said first conductivity type and implanting dopant of a second conductivity type opposite to said first conductivity type into said epitaxial layer.

10. The process of claim 9 comprising heating said epitaxial layer so as to diffuse said dopant of said second conductivity type to an interface between said epitaxial layer and said substrate.

11. The process of claim 7 comprising implanting dopant of said second conductivity type into said epitaxial layer to form a body region.

12. The process of claim 7 wherein implanting dopant of said first conductivity type through a bottom of the trench to form a region of dopant comprises implanting dopant at an energy of from 30 keV to 300 keV.

13. A process of fabricating a power MOSFET comprising:
providing a substrate of a first conductivity type;
providing an epitaxial layer of a second conductivity type opposite to said first conductivity type on the substrate;
forming a trench in the epitaxial layer;
implanting dopant of said first conductivity type through a bottom of the trench to form a deep layer of dopant beneath said trench and approximately at an interface between said substrate and said epitaxial layer, said deep layer of dopant being located below and separated from said trench;
heating said substrate so as to cause said deep layer of dopant to diffuse upward so as to form a drift-drain region extending from said bottom of said trench to said substrate;
forming an insulating layer along the bottom and a sidewall of the trench;
introducing a conductive gate material into the trench; and
introducing dopant of the first conductivity type into the epitaxial layer to form a source region, the drain-drift region and the source region being formed under conditions such that the source region and drain-drift region are separated by a channel region of the epitaxial layer adjacent the sidewall of the trench.

14. The process of claim 13 wherein providing an epitaxial layer comprises growing an epitaxial layer of the second conductivity type on the substrate.

15. The process of claim 13 wherein providing an epitaxial layer comprises growing an epitaxial layer of said first conductivity type and implanting dopant of a second conductivity type opposite to said first conductivity type into said epitaxial layer.

16. The process of claim 15 comprising heating said epitaxial layer so as to diffuse said dopant of said second conductivity type to an interface between said epitaxial layer and said substrate.

17. The process of claim 13 comprising implanting dopant of said second conductivity type into said epitaxial layer to form a body region.

18. The process of claim 13 wherein implanting dopant of said first conductivity type through a bottom of the trench to form a deep layer of dopant comprises implanting dopant at an energy of from 300 keV to 3.0 MeV.

19. A process of fabricating a power MOSFET comprising:
providing a substrate of a first conductivity type;
providing an epitaxial layer of a second conductivity type opposite to said first conductivity type on the substrate;
forming a trench in the epitaxial layer;
implanting dopant of said first conductivity type through a bottom of the trench to form a deep layer of dopant beneath said trench and approximately at an interface between said substrate and said epitaxial layer;
implanting dopant of said first conductivity type through a bottom of the trench to form a region of dopant beneath said trench and within said epitaxial layer, said region of dopant being located above and separated from said deep layer of dopant;
heating said substrate so as to cause said deep layer of dopant to diffuse upward and said region of dopant to diffuse downward, said deep layer and said region merging to form a drift-drain region extending from said bottom of said trench to said substrate;
forming an insulating layer along the bottom and a sidewall of the trench;
introducing a conductive gate material into the trench; and
introducing dopant of the first conductivity type into the epitaxial layer to form a source region, the drain-drift region and the source region being formed under conditions such that the source region and drain-drift region are separated by a channel region of the epitaxial layer adjacent the sidewall of the trench.

20. The process of claim 19 wherein providing an epitaxial layer comprises growing an epitaxial layer of the second conductivity type on the substrate.

21. The process of claim 19 wherein providing an epitaxial layer comprises growing an epitaxial layer of said first conductivity type and implanting dopant of a second conductivity type opposite to said first conductivity type into said epitaxial layer.

22. The process of claim 21 comprising heating said epitaxial layer so as to diffuse said dopant of said second conductivity type to an interface between said epitaxial layer and said substrate.

23. The process of claim 19 comprising implanting dopant of said second conductivity type into said epitaxial layer to form a body region.

24. The process of claim 19 wherein implanting dopant of said first conductivity type through a bottom of the trench to form a region of dopant comprises implanting dopant at an energy of from 30 keV to 300 keV.

25. The process of claim 19 wherein implanting dopant of said first conductivity type through a bottom of the trench to form a deep layer of dopant comprises implanting dopant at an energy of from 300 keV to 3.0 MeV.

26. A process of fabricating a power MOSFET comprising:
providing a substrate of a first conductivity type;
growing an epitaxial layer on the substrate;
forming a trench in the epitaxial layer;
implanting dopant of said first conductivity type through a bottom of the trench to form a first region of dopant beneath said trench;
implanting dopant of said first conductivity type through a bottom of the trench to form a second region of dopant beneath said trench, said first and second regions overlapping each other immediately after said implanting, said first and second regions being arranged in a stack extending between said trench and said substrate;
forming an insulating layer along the bottom and a sidewall of the trench;
introducing a conductive gate material into the trench; and
introducing dopant of the first conductivity type into the epitaxial layer to form a source region, the drain-drift region and the source region being formed under conditions such that the source region and drain-drift region are separated by a channel region of the epitaxial layer adjacent the sidewall of the trench.

27. The process of claim 26 where said substrate is not subjected to any substantial thermal processing after said implanting of dopant to form said first and second regions.

28. A process of fabricating a power MOSFET comprising:
providing a substrate of a first conductivity type;
growing an epitaxial layer on the substrate;
forming a trench in the epitaxial layer;
implanting dopant of said first conductivity type through a bottom of the trench at a plurality of predetermined energies to form a plurality of dopant regions of dopant beneath said trench, immediately after said implanting adjacent ones of said dopant regions overlapping so as to form a stack extending between said trench and said substrate;

forming an insulating layer along the bottom and a sidewall of the trench;

introducing a conductive gate material into the trench; and introducing dopant of the first conductivity type into the epitaxial layer to form a source region, the drain-drift region and the source region being formed under conditions such that the source region and drain-drift region are separated by a channel region of the epitaxial layer adjacent the sidewall of the trench.

* * * * *